(12) United States Patent
Yeo et al.

(10) Patent No.: US 7,268,024 B2
(45) Date of Patent: Sep. 11, 2007

(54) SEMICONDUCTOR-ON-INSULATOR CHIP INCORPORATING STRAINED-CHANNEL PARTIALLY-DEPLETED, FULLY-DEPLETED, AND MULTIPLE-GATE TRANSISTORS

(75) Inventors: Yee-Chia Yeo, Hsin-Chu (TW); How-Yu Chen, Kaohsiung (TW); Chien-Chao Huang, Hsin-Chu (TW); Wen-Chin Lee, Hsin-Chu (TW); Fu-Liang Yang, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/999,564

(22) Filed: Nov. 29, 2004

(65) Prior Publication Data
US 2005/0093067 A1 May 5, 2005

Related U.S. Application Data

(62) Division of application No. 10/426,566, filed on Apr. 30, 2003, now Pat. No. 6,867,433.

(51) Int. Cl.
*H01L 21/84* (2006.01)
(52) U.S. Cl. ............................ 438/151; 438/164
(58) Field of Classification Search ............... 438/149, 438/151, 164
See application file for complete search history.

(56) References Cited

U.S. PATENT DOCUMENTS

| | | | |
|---|---|---|---|
| 4,069,094 A | 1/1978 | Shaw et al. | |
| 4,314,269 A | 2/1982 | Fujiki | |
| 4,497,683 A | 2/1985 | Celler et al. | |
| 4,631,803 A | 12/1986 | Hunter et al. | |
| 4,892,614 A | 1/1990 | Chapman et al. | |
| 4,946,799 A | 8/1990 | Blake et al. | |
| 4,952,993 A | 8/1990 | Okumura | |
| 5,130,773 A | 7/1992 | Tsukada | |

(Continued)

FOREIGN PATENT DOCUMENTS

EP 0683522 A2 11/1995

(Continued)

OTHER PUBLICATIONS

Wang, L.K., et al., "On-Chip Decoupling Capacitor Design to Redce Switching-Noise-Induced Instability in CMOS/SOI VLSI," Proceedings of the 1995 IEEE International SOI Conference, Oct. 1995. pp. 100-101.

(Continued)

*Primary Examiner*—N. Drew Richards
(74) *Attorney, Agent, or Firm*—Slater & Matsil, L.L.P.

(57) ABSTRACT

In accordance with a preferred embodiment of the present invention, a silicon-on-insulator (SOI) chip includes a silicon layer of a predetermined thickness overlying an insulator layer. A multiple-gate fully-depleted SOI MOSFET including a strained channel region is formed on a first portion of the silicon layer. A planar SOI MOSFET including a strained channel region formed on another portion of the silicon layer. For example, the planar SOI MOSFET can be a planar fully-depleted SOI (FD-SOI) MOSFET or the planar SOI MOSFET can be a planar partially-depleted SOI (PD-SOI) MOSFET.

26 Claims, 9 Drawing Sheets

U.S. PATENT DOCUMENTS

| | | |
|---|---|---|
| 5,155,571 A | 10/1992 | Wang et al. |
| 5,273,915 A | 12/1993 | Hwang et al. |
| 5,338,960 A | 8/1994 | Beasom |
| 5,378,919 A | 1/1995 | Ochiai |
| 5,447,884 A | 9/1995 | Fahey et al. |
| 5,461,250 A | 10/1995 | Burghartz et al. |
| 5,479,033 A | 12/1995 | Baca et al. |
| 5,534,713 A | 7/1996 | Ismail et al. |
| 5,596,529 A | 1/1997 | Noda et al. |
| 5,629,544 A | 5/1997 | Voldman et al. |
| 5,656,524 A | 8/1997 | Eklund et al. |
| 5,708,288 A | 1/1998 | Quigley et al. |
| 5,714,777 A | 2/1998 | Ismail et al. |
| 5,763,315 A | 6/1998 | Benedict et al. |
| 5,789,807 A | 8/1998 | Correale, Jr. |
| 5,811,857 A | 9/1998 | Assaderaghi et al. |
| 5,955,766 A | 9/1999 | Ibi et al. |
| 5,965,917 A * | 10/1999 | Maszara et al. ............ 257/347 |
| 5,972,722 A | 10/1999 | Visokay et al. |
| 6,008,095 A | 12/1999 | Gardner et al. |
| 6,015,990 A | 1/2000 | Hieda et al. |
| 6,015,993 A | 1/2000 | Voldman et al. |
| 6,046,487 A | 4/2000 | Benedict et al. |
| 6,059,895 A | 5/2000 | Chu et al. |
| 6,100,153 A | 8/2000 | Nowak et al. |
| 6,103,599 A | 8/2000 | Henley et al. |
| 6,107,125 A | 8/2000 | Jaso et al. |
| 6,111,267 A | 8/2000 | Fischer et al. |
| 6,222,234 B1 | 4/2001 | Imai |
| 6,232,163 B1 | 5/2001 | Voldman et al. |
| 6,256,239 B1 | 7/2001 | Akita et al. |
| 6,258,664 B1 | 7/2001 | Reinberg |
| 6,281,059 B1 | 8/2001 | Cheng et al. |
| 6,291,321 B1 | 9/2001 | Fitzgerald |
| 6,294,834 B1 | 9/2001 | Yeh et al. |
| 6,303,479 B1 * | 10/2001 | Snyder ................ 438/581 |
| 6,339,232 B1 | 1/2002 | Takagi |
| 6,358,791 B1 | 3/2002 | Hsu et al. |
| 6,387,739 B1 | 5/2002 | Smith, III |
| 6,407,406 B1 | 6/2002 | Tezuka |
| 6,413,802 B1 | 7/2002 | Hu et al. |
| 6,414,355 B1 | 7/2002 | An et al. |
| 6,429,061 B1 | 8/2002 | Rim |
| 6,433,382 B1 | 8/2002 | Orlowski et al. |
| 6,448,114 B1 | 9/2002 | An et al. |
| 6,448,613 B1 | 9/2002 | Yu |
| 6,475,838 B1 | 11/2002 | Bryant et al. |
| 6,475,869 B1 | 11/2002 | Yu |
| 6,489,664 B2 | 12/2002 | Re et al. |
| 6,498,359 B2 | 12/2002 | Schmidt et al. |
| 6,518,610 B2 | 2/2003 | Yang et al. |
| 6,521,952 B1 | 2/2003 | Ker et al. |
| 6,524,905 B2 | 2/2003 | Yamamichi et al. |
| 6,525,403 B2 | 2/2003 | Inaba et al. |
| 6,555,839 B2 | 4/2003 | Fitzgerald |
| 6,558,998 B2 | 5/2003 | Belleville et al. |
| 6,573,172 B1 | 6/2003 | En et al. |
| 6,576,526 B2 | 6/2003 | Kai et al. |
| 6,586,311 B2 | 7/2003 | Wu |
| 6,600,170 B1 | 7/2003 | Xiang |
| 6,617,643 B1 | 9/2003 | Goodwin-Johansson |
| 6,621,131 B2 | 9/2003 | Murthy et al. |
| 6,633,070 B2 | 10/2003 | Miura et al. |
| 6,653,700 B2 | 11/2003 | Chau et al. |
| 6,657,259 B2 * | 12/2003 | Fried et al. ................ 257/350 |
| 6,657,276 B1 | 12/2003 | Karlsson et al. |
| 6,674,100 B2 | 1/2004 | Kubo et al. |
| 6,686,247 B1 | 2/2004 | Bohr |
| 6,720,619 B1 | 4/2004 | Chen et al. |
| 6,724,019 B2 | 4/2004 | Oda et al. |
| 6,759,717 B2 | 7/2004 | Sagarwala et al. |
| 6,762,448 B1 | 7/2004 | Lin et al. |
| 6,784,101 B1 | 8/2004 | Yu et al. |
| 6,794,764 B1 | 9/2004 | Kamal et al. |
| 6,797,556 B2 | 9/2004 | Murthy et al. |
| 6,803,641 B2 | 10/2004 | Papa Rao et al. |
| 6,812,103 B2 | 11/2004 | Wang et al. |
| 6,872,610 B1 | 3/2005 | Mansoori et al. |
| 6,885,084 B2 | 4/2005 | Murthy et al. |
| 6,891,192 B2 | 5/2005 | Chen et al. |
| 2002/0031890 A1 | 3/2002 | Watanabe et al. |
| 2002/0074598 A1 | 6/2002 | Doyle et al. |
| 2002/0076899 A1 | 6/2002 | Skotnicki et al. |
| 2002/0125471 A1 | 9/2002 | Fitzgerald et al. |
| 2002/0153549 A1 | 10/2002 | Laibowitz et al. |
| 2002/0190284 A1 | 12/2002 | Murthy et al. |
| 2003/0001219 A1 | 1/2003 | Chau et al. |
| 2003/0030091 A1 | 2/2003 | Bulsara et al. |
| 2003/0080386 A1 | 5/2003 | Ker et al. |
| 2004/0026765 A1 | 2/2004 | Currie et al. |
| 2004/0087098 A1 | 5/2004 | Ng et al. |
| 2004/0173815 A1 | 9/2004 | Yeo et al. |
| 2004/0217448 A1 | 11/2004 | Kumagal et al. |
| 2004/0262663 A1 | 12/2004 | Bohr et al. |
| 2004/0266116 A1 | 12/2004 | Mears et al. |
| 2005/0029601 A1 | 2/2005 | Chen et al. |
| 2005/0121727 A1 | 6/2005 | Ishitsuke et al. |
| 2005/0224986 A1 | 10/2005 | Tseng et al. |
| 2005/0236694 A1 | 10/2005 | Wu et al. |

FOREIGN PATENT DOCUMENTS

| | | |
|---|---|---|
| EP | 0828296 A2 | 3/1998 |
| WO | WO 03/017336 A2 | 2/2003 |

OTHER PUBLICATIONS

Yeoh, J.C., et al., "MOS Gated Si:SiGe Quantum Wells Formed by Anodic Oxidation," Semicond. Sci. Technol. (1998), vol. 13, pp. 1442-1445, IOP Publishing Ltd., UK.

Cavassilas, N., et al., "Capacitance-Voltage Characteristics of Metal-Oxide-Strained Semiconductor Si/SiGe Heterostructures," Nanotech 2002, vol. 1, pp. 600-603.

Blaauw, D., et al.,"Gate Oxide and Subthreshold Leakage Characterization, Analysis and Optimization," date unknown, 2 pages.

"Future Gate Stack," International Sematech, 2001 Annual Report, 2 pages.

Chang, L., et al., "Reduction of Direct-Tunneling Gate Leakage Current in Double-Gate and Ultra-Thin Body MOSFETs," 2001 IEEE, Berkeley, CA.

Chang, L., et al., "Direct-Tunneling Gate Leakage Current in Double-Gate and Ultrathin Body MOSFETs," 2002 IEEE, vol. 49, No. 12, pp. 2288-2295, Dec. 2002.

Huang, X., et al. "Sub-50 nm P-Channel FinFET," IEEE Transactions on Electron Devices, vol. 48, No. 5 (May 2001) pp. 880-886.

Shahidi, G.G. "SOI Technology for the GHz era," IBM Journal of Research and Development, vol. 46, No. 2/3 (Mar./May 2002) pp. 121-131.

Shimizu, A., et al., "Local Mechanical-Stress Control (LMC): A New Technique for CMOS-Performance Enhancement," International Electron Devices Meeting (2001) pp. 433-436.

Wong, H.-S.P. "Beyond the Conventional Transistor," IBM Journal of Research and Development (Mar./May 2002) pp. 133-167.

Yang, F.L., et al. "25nm CMOS Omega FETs," International Electron Devices Meeting, Digest of Technical Papers, (Dec. 2002) pp. 255-258.

Yang, F.L., et al. "35nm CMOS FinFETs," 2002 Symposium on VLSI Technology Digest of Technical Papers, (Jun. 2002) pp. 104-105.

Ismail, K., et al., "Electron Transport Properties of Si/SiGe Heterostructures: Measurements and Device Implications," Applied Physics Letters, vol. 63, No. 5 (Aug. 2, 1993), pp. 660-662.

Nayak, D.K., et al. "Enhancement-Mode Quantum-Well $Ge_xSi_{1-x}$ PMOS," IEEE Electron Device Letters, vol. 12, No. 4 (Apr. 1991), pp. 154-156.

Gámiz, F., et al., "Strained-Si/SiGe-on-Insulator Inversion Layers: The Role of Strained-Si Layer Thickness on Electron Mobility," Applied Physics Letters, vol. 80, No. 22, (Jun. 3, 2002), pp. 4160-4162.

Gámiz, F., et al., "Electron Transport in Strained Si Inversion Layers Grown on SiGe-on-Insulator Substrates," Journal of Applied Physics, vol. 92, No. 1, (Jul. 1, 2002), pp. 288-295.

Mizuno, T., et al. "Novel SOI p-Channel MOSFETs With Higher Strain in Si Channel Using Double SiGe Heterostructures," IEEE Transactions on Electron Devices, vol. 49, No. 1 (Jan. 2002) pp. 7-14.

Tezuka, T., et al., "High-performance Strained Si-on-Insulator MOSFETs by Novel Fabrication Processes Utilizing Ge-Condensation Technique," Symposium On VLSI Technology Digest of Technical Papers, (2002), pp. 96-97.

Jurczak M., et al., "Silicon-on-Nothing (SON)—an Innovative Process for Advanced CMOS," IEEE Transactions on Electron Devices, vol. 47, No. 11, (Nov. 2000), pp. 2179-2187.

Jurczak M., et al., "SON (Silicon-on-Nothing—A New Device Architecture for the ULSI Era," Symposium on VLSI Technology Digest of Technical Papers, (1999), pp. 29-30.

Maiti, C.K., et al., "Film Growth and Material Parameters," Application of Silicon-Germanium Heterostructure, Institute of Physics Publishing, Ch. 2 (2001) pp. 32-42.

Tiwari, S., et al., "Hole Mobility Improvement in Silicon-on-Insulator and Bulk Silicon Transistors Using Local Strain," International Electron Device Meeting, (1997), pp. 939-941.

Ootsuka, F., et al., "A Highly Dense, High-Performance 130nm Node CMOS Technology for Large Scale System-on-a-Chip Applications," International Electron Device Meeting, (2000), pp. 575-578.

Matthews, J.W., et al., "Defects in Epitaxial Multilayers—I. Misfit Dislocations," Journal of Crystal Growth, vol. 27, (1974), pp. 118-125.

Matthews, J.W., et al., "Defects in Epitaxial Multilayers—II. Dislocation Pile-Ups, Threading Dislocations, Slip Lines and Cracks" Journal of Crystal Growth, vol. 29, (1975), pp. 273-280.

Matthews, J.W., et al., "Defects in Epitaxial Multilayers—III. Preparation of Almost Perfect Multilayers," Journal of Crystal Growth, vol. 32, (1976), pp. 265-273.

Matthews, J.W., et al., "Defects Associated with the Accommodation of Misfit Between Crystals," J. Vac. Sci. Technol., vol. 12, No. 1, (Jan./Feb. 1975), pp. 126-133.

Schüppen, A., et al., "Mesa and Planar SiGe-HBTs on MBE-Wafers," Journal of Materials Science: Materials in Electronics, vol. 6, (1995), pp. 298-305.

Thompson, S., et al. "A 90 nm Logic Technology Featuring 50nm Strained Silicon Channel Transistors, 7 layers of Cu Interconnects, Low k ILD, and 1 um2 SRAM cell," International Electron Devices Meeting (Dec. 2002) pp. 61-64.

Welser, J., et al. "NMOS and PMOS Transistors Fabricated in Strained Silicon/Relaxed Silicon-Germanium Structures," International Electron Devices Meeting (Dec. 1992) pp. 1000-1002.

Leitz, C. W., et al., "Hole mobility enhancements in strained $Si/Si_{1-y}Ge_y$ p-type metal-oxide-semiconductor field-effect transistors grown on relaxed $Si_{1-x}Ge_x$ (x<y) virtual substrates," Applied Physics Letters, Dec. 17, 2001, pp. 4246-4248, vol. 79, No. 25.

Leitz, C. W., et al., "Channel Engineering of SiGe-Based Heterostructures for High Mobility MOSFETs," Mat. Res. Soc. Symp. Proc., 2002, pp. 113-118, vol. 686.

Liu, K. C., et al., "A Novel Sidewall Strained-Si Channel nMOSFET," IEDM, 1999, pp. 63-66.

Wolf, S., et al., "Silicon Processing For The VLSI Era," vol. 1: Process Technology, Second Edition, Lattice Press, Sunset Beach, California, 2000, pp. 834-835.

Wolf, S., "Silicon Processing For The VLSI Era," vol. 2: Process Integration, Lattice Press, Sunset Beach, California, 1990, pp. 144-145.

* cited by examiner

SEMICONDUCTOR-ON-INSULATOR CHIP INCORPORATING STRAINED-CHANNEL PARTIALLY-DEPLETED, FULLY-DEPLETED, AND MULTIPLE-GATE TRANSISTORS

CROSS-REFERENCE TO RELATED APPLICATIONS

This invention is a divisional of Ser. No. 10/426,566, filed April 30, 2003, now U.S. Pat. No. 6,867,433.

The following U.S. patents and/or commonly assigned patent applications are hereby incorporated herein by reference:

| Patent or Ser. No. | Filing Date | Issue Date | Attorney Docket No. |
|---|---|---|---|
| 10/305,841 | Nov. 26, 2002 | | TSMC2002-0895 |
| 10/319,119 | Dec. 12, 2002 | | TSMC2002-0979 |
| 10/379,873 | Mar. 5, 2003 | | TSMC2002-1384 |
| 10/384,859 | Mar. 10, 2003 | | TSMC2002-1385 |

TECHNICAL FIELD

The present invention relates generally to the fabrication of semiconductor devices. More particularly, the preferred embodiment of the present invention relates to semiconductor-on-insulator chips incorporating partially-depleted, fully-depleted, and multiple-gate devices, and the introduction of strain in the channel of these devices.

BACKGROUND

Semiconductor device geometries have dramatically decreased in size since such devices were first introduced several decades ago. Since then, integrated circuits have generally followed the two year/half-size rule (often called Moore's Law), which means that the number of devices on a chip doubles every two years. Today's semiconductor fabrication plants are routinely producing devices having 130 nm and even 90 nm feature sizes.

The desire for higher performance circuits has driven the development of high-speed sub-100 nanometer (nm) silicon-on-insulator (SOI) complementary metal-oxide-semiconductor (CMOS) technology. In SOI technology, metal-oxide semiconductor field-effect transistors (MOSFETs) are formed on a thin layer of silicon overlying a layer of insulating material such as silicon oxide. Devices formed on SOI offer many advantages over their bulk counterparts, including reduced junction capacitance, absence of reverse body effect, soft-error immunity, full dielectric isolation, and absence of latch-up. SOI technology therefore enables higher speed performance, higher packing density, and reduced power consumption.

There are two types of conventional SOI devices: partially-depleted SOI (PD-SOI) devices, and fully-depleted (FD-SOI) devices. Conventional PD-SOI MOSFET is one in which the body thickness is thicker than the maximum depletion layer width $W_{d,max}$, and a conventional FD-SOI MOSFET is one in which the body thickness is thinner than $W_{d,max}$. The conventional PD-SOI and FD-SOI devices are planar devices, i.e., they are formed in the plane of the wafer.

It is noticed that remarkable progress has recently been achieved in PD-SOI technology. Although PD-SOI devices have the merit of being highly manufacturable, significant design burdens are faced by its users because of floating body effects. In PD-SOI devices, charge carriers generated by impact ionization near one source/drain region accumulate near the other source/drain region of the transistor. When sufficient carriers accumulate in the floating body, which is formed right below the channel region, the body potential is effectively altered.

Floating body effects occur in PD-SOI devices because of charge build-up in the floating body region. This results in kinks in the device current-voltage (I-V) curves, thereby degrading the electrical performance of the circuit. In general, the body potential of a PD-SOI device may vary during static, dynamic, or transient device operation, and is a function of many factors like temperature, voltage, circuit topology, and switching history. Therefore, circuit design using PD-SOI devices is not straightforward, and there is a significant barrier for the adoption of PD-SOI technology or the migration from bulk-Si design to PD-SOI design.

One traditional way to suppress floating body effects in PD-SOI devices is to provide an extra electrical connection to the body by adding a contact to the body for collection of current due to impact ionization. Various methods of making a contact to the body of a SOI transistor are known, but various disadvantages are known to be associated with these methods. One method for the suppression of the SOI floating-body effects is to use a linked-body device structure. However, the method is limited by a high body contact resistance.

Blake et al., in U.S. Pat. No. 4,946,799, described a process for making a body node to source node connection, where a contact region of the same conductivity type as the body node is formed within the source region in a self-aligned fashion, thus eliminating the floating body effects. In U.S. Pat. No. 6,387,739 issued to G. E. Smith III et al., a method for forming a body contact structure for SOI transistor is described.

Another way of avoiding floating body effects in SOI devices is to adopt a fully-depleted SOI (FD-SOI) technology. FD-SOI devices do not suffer from floating-body effects due to the fact that the body is fully-depleted. FD-SOI technology is therefore design-friendly since floating-body effects need not be accounted for in circuit design.

In a FD-SOI technology, devices with a low body-doping and/or a thin body thickness are used. Additionally, for good control of short-channel effects in ultra-scaled devices, the device body thickness is usually reduced to less than one third of gate length. Such a thin body thickness would require raised source/drain technology for series resistance reduction. However, raised source/drain formation, currently performed by selective epitaxy, is immature, expensive, pattern-density dependent, and may result in reduced manufacturing yield. In addition, SOI substrates with uniform ultra-thin Si films, as required for the manufacture of FD-SOI devices with ultra-thin body, are currently unavailable. Non-uniformity of the Si film thickness will result in significant fluctuations in the device characteristics and negatively impact the ease of manufacture.

U.S. Pat. No. 6,222,234, issued to K. Imai, describes a method for the fabrication of FD-SOI and PD-SOI devices on the same substrate. U.S. Pat. No. 6,414,355 issued to An et al. described the structure of silicon-on-insulator chips with an active layer of non-uniform thickness. U.S. Pat. No. 6,448,114 issued to An et al. described several methods of forming silicon-on-insulator chips with an active layer of non-uniform thickness. In these three patents, a SOI substrate with two different silicon film thicknesses is provided, where the FD-SOI devices reside in a region with a thinner silicon film, and the PD-SOI devices reside in a region with a thicker silicon film.

FIG. 2 illustrates a prior art integration of FD-SOI and PD-SOI transistors in the same chip, where FD-SOI transistors 12 are formed in a thin silicon layer 14 and PD-SOI transistors 16 are formed in thick silicon layer 18. The silicon layers 16 and 18 are both formed directly on a buried oxide 20, which is directly on a silicon substrate 22. Active areas 24 within the silicon layers 16 and 18 are separated from one another by isolation regions 26.

Other techniques have also been used to enhance transistor performance. For example, strain may be introduced in the transistor channel for improving carrier mobilities. Therefore, strain-induced mobility enhancement is another way to improve transistor performance in addition to device scaling.

In one approach, strain in the channel is introduced after the transistor is formed. In this approach, a high stress film 32 is formed over a completed transistor structure 30, as shown in FIG. 1. The stressor 32, i.e., the high stress film, exerts significant influence on the channel 34, modifying the silicon lattice spacing in the channel region 34, and thus introducing strain in the channel region 34. As shown in FIG. 1, the stressor is placed above the complete planar transistor structure, which includes a source 34 and a drain 38 formed in silicon region 40. A gate 42 overlies channel region 34 and is separated therefrom by gate dielectric 44. Sidewall spacer 46 can be included adjacent gate 42. This scheme is described in detail in a paper by A. Shimizu et at, entitled "Local mechanical stress control (LMC): a new technique for CMOS performance enhancement," published in pp. 433-436 of the *Digest of Technical Papers* of the 2001 *International Electron Device Meeting*. The strain contributed by the high stress film is believed to be uniaxial in nature with a direction parallel to the source-to-drain direction.

SUMMARY OF THE INVENTION

In one embodiment, the present invention provides a method and system that overcomes the shortcomings of the prior art, and provides a highly manufacturable PD-SOI-like technology that produces FD-SOI type devices to eliminate floating body effects. Other embodiments of the invention provide a novel transistor geometry to magnify the effect of high-stress film on the channel strain. The present disclosure teaches a method of forming such a transistor.

In accordance with a preferred embodiment of the present invention, a silicon-on-insulator (SOI) chip includes a silicon layer of a predetermined thickness overlying an insulator layer. A multiple-gate fully-depleted SOI MOSFET including a strained channel region is formed on a first portion of the silicon layer. A planar SOI MOSFET including a strained channel region formed on another portion of the silicon layer. For example, the planar SOI MOSFET can be a planar fully-depleted SOI (FD-SOI) MOSFET or the planar SOI MOSFET can be a planar partially-depleted SOI (PD-SOI) MOSFET.

In accordance with another preferred embodiment of the present invention, an SOI chip including a multiple-gate fully-depleted SOI MOSFET has an insulator layer and a silicon fin overlying a portion of the insulator layer. A strained channel region formed in a portion of the silicon fin and a gate dielectric layer overlying the strained channel region is also included. A gate electrode is formed on the gate dielectric layer and a source region and a drain region is formed on portions of the semiconductor fin adjacent to the strained channel region, such that the source region is separated from the drain region by the strained channel region.

Another embodiment provides a method of forming a silicon-on-insulator device with a strained channel. In this method a silicon-on-insulator substrate that includes a silicon layer overlying an insulator layer is provided. At least one active region is defined in the silicon layer. A gate dielectric layer is formed in the active region and a gate electrode is formed on the gate dielectric layer. Source and drain regions can then be formed adjacent to the gate electrode and a high-stress film covers the gate electrode, source region, and drain region.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The present invention is related to co-pending applications Ser. No. 10/305,841 entitled "Strained-Channel Multiple-Gate Transistor", filed Nov. 26, 2002 and Ser. No. 10/319,119 entitled "Semiconductor-on-Insulator Chip Incorporating Partially-Depleted, Fully-Depleted, and Multiple-Gate Devices", filed Dec. 12, 2002. Aspects of the present invention provide improvements.

For example, the preferred embodiment of the present invention teaches a method and architecture to incorporate partially-depleted SOI (PD-SOI) and fully-depleted SOI (FD-SOI) transistors in the same chip, and, to provide enhanced strain effects to improve carrier mobilities and device performance in ultra-scaled devices. Unlike other devices that utilize different silicon thicknesses to achieve FD-SOI and PD-SOI transistors on the same chip, the preferred embodiment of the present invention employs a PD-SOI technology while implementing FD-SOI transistors by rearranging the transistor geometry, or by configuring the channel doping concentrations to achieve full transistor body depletion at selected channel lengths or channel widths. In this manner, it is possible to provide FD-SOI and PD-SOI transistors with similar silicon body thicknesses.

Two types of FD-SOI transistors are provided on the same chip: a planar FD-SOI type transistor where the depletion width is larger than the silicon thickness; and a non-planar multiple-gate transistor or FinFET-like FD-SOI transistor, which makes use of a novel device geometry to eliminate floating body effects. In general, planar FD-SOI transistors have widths of more than 50 nm while non-planar fully-depleted multiple-gate transistors have widths of less than 50 nm.

Concepts of the preferred embodiment of this invention are more clearly illustrated in FIGS. 3a-3d. FIGS. 3a-3d illustrate partially depleted SOI transistors and fully depleted SOI transistors of the present invention. The fully-depleted transistor of FIGS. 3b uses a low body doping so that the maximum depletion width is larger than the silicon thickness to achieve full-depletion. The fully-depleted transistor of FIG. 3d uses a novel geometry to allow the encroachment of gate electric field from the sides of the silicon body to achieve full body depletion.

Figure 1:
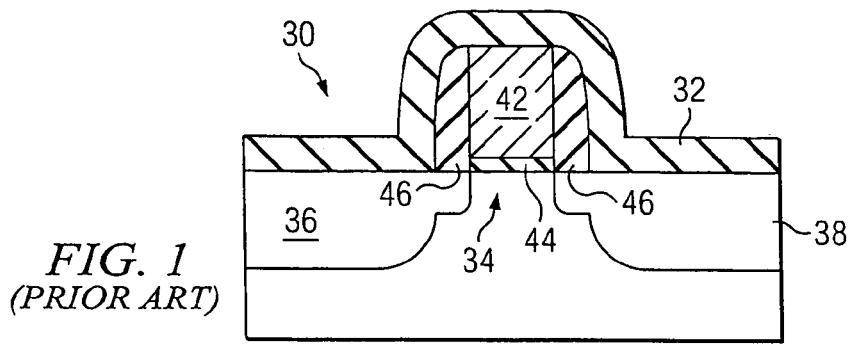
FIG. 1 shows a prior art planar transistor with a strained channel.
Figure 2:
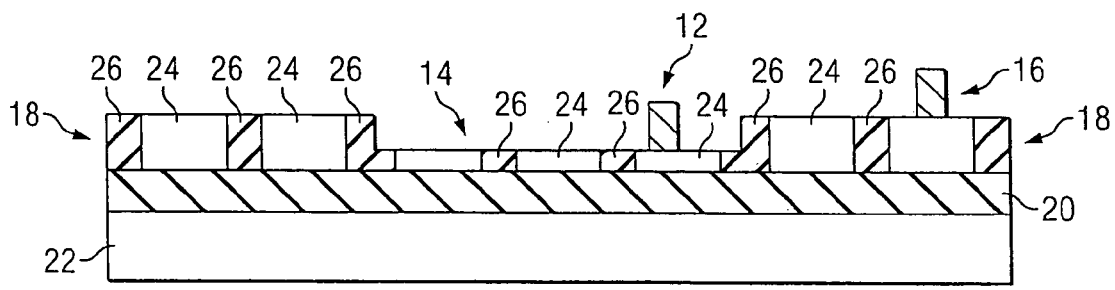
FIG. 2 shows a prior art integration of PD-SOI and FD-SOI transistors in the same chip by using a silicon-on-insulator wafer with multiple-thickness silicon layer thicknesses.
Figure 3A:
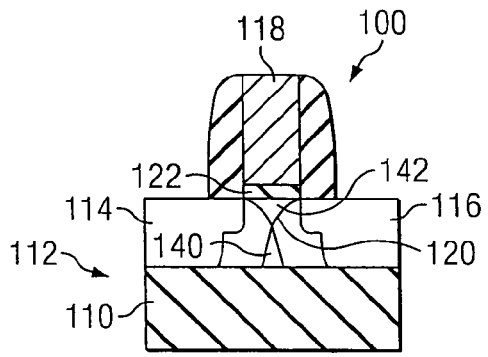
FIGS. 3a-3d illustrate partially depleted SOI transistors and a fully depleted SOI transistors of the present invention.
Figure 3B:
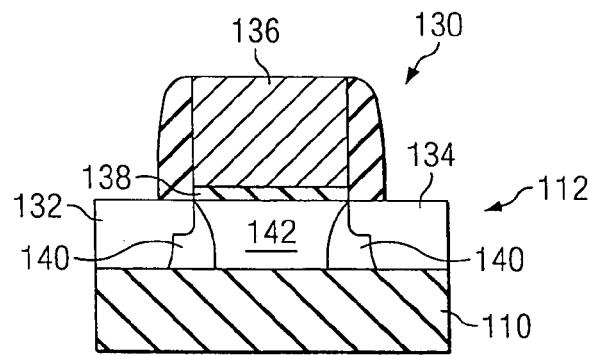

Super-halo doping and light body doping are designed to achieve FD-SOI and PD-SOI devices at different gate lengths, as shown in FIGS. 3a and 3b. Referring first to FIG. 3a, a partially-depleted transistor device 100 is formed over a buried insulator 110, while not shown, the buried insulator 110 is formed over a substrate, e.g., an undoped or lightly doped silicon substrate.

The buried insulator 110 is typically an oxide such as silicon dioxide. Other insulators, such as silicon nitride or aluminum oxide, may alternatively be used. In some embodiments, the buried insulator can comprise a stack of layers, e.g., an oxide, nitride, oxide stack.

Transistor device 100 is formed in a semiconductor layer 112 and includes a source region 114 and a drain region 116. A gate 118 overlies a channel 120 and is separated therefrom by gate dielectric 122.

Similarly long-channel transistor 130 includes a source 132, a drain 134, a gate 136, and a gate dielectric 138. The transistor 130 can be formed in the same semiconductor layer 112 as transistor 100 or in a different semiconductor layer e.g., a different island or mesa on the same chips.

One feature is the design of the super-halo doping 140 in FIG. 3b (or double halo doping 140 in FIG. 3a) and light body doping 142 such that the effective doping concentration of the transistor body decreases as the gate length is increased. The doping concentration in the super-halo region 140 is in the range of about $1 \times 10^{18}$ to about $2 \times 10^{19}$ dopants per cubic centimeter. The doping concentration in the lightly doped body region 142 is in the range of about $1 \times 10^{16}$ to about $1 \times 10^{18}$ dopants per cubic centimeter.

In FIG. 3a, the high super-halo doping concentration 140 in a short-channel transistor 100 results in a maximum depletion width that is smaller than the silicon film 112 thickness, and the transistor body is therefore partially-depleted. As the gate 118 length increases, an increasing portion of the body region is constituted by the lightly doped body region 142, and the effective body concentration decreases or the maximum depletion width increases. In FIG. 3b, the long-channel transistor 130 has a light body-doping and a maximum depletion width that is larger than the silicon film 112 thickness, and the transistor body is fully-depleted.

Figure 3C:
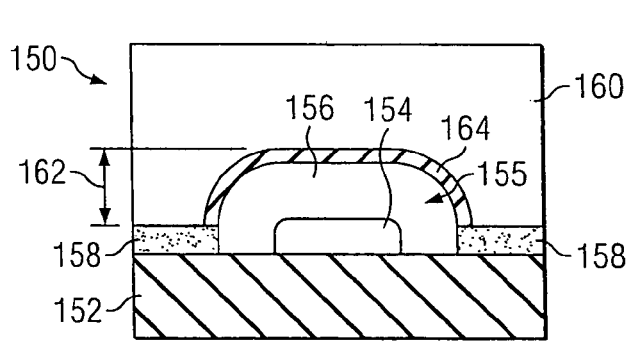
Figure 3D:
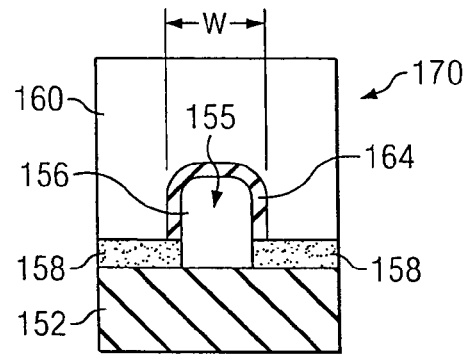

Referring now to FIGS. 3c and 3d, another way to achieve full depletion in the transistor body is to allow the electric field lines to encroach from the sides of the transistor body by using a novel transistor geometry. Referring now to FIG. 3c, a transistor 150 is formed over a buried insulator. The buried insulator 152 can include any of the characteristics described above with respect to insulator 110 and may be formed on a substrate, where the discussion above with respect to FIGS. 3a and 3b equally applies here. In this device, an active semiconductor layer region 155 includes a body region 154 and a depletion region 156. The active region 155 is isolated from the other active regions by isolation region 158. This isolation region 158 is preferably a shallow trench isolation (STI) region. It is understood that other isolation structures may be used.

A gate electrode 160 is formed to surround the transistor active region, e.g., the channel region. Accordingly, an intentional recess 162 is formed within the isolation region 158 so that the semiconductor layer 155 includes sidewalls. The gate electrode 160 is adjacent to the top surface as well as the sidewalls of active layer 155. A gate dielectric layer 164 is formed between the gate electrode 160 and the active layer 155.

The source and drain regions of the transistor device 150 are not shown in the illustration of FIG. 3c. In this case, the channel current flows into and out of the page. As a result, one of the source/drain regions will be located in a plane above the page and the other located in a plane below the page.

FIG. 3d shows a similar structure for a FinFET-like transistor device 170. Like elements from FIG. 3c have been labeled with the same reference numerals. In this case, the active semiconductor layer is thin causing the body to be fully depleted.

One feature of the novel transistor geometry is the intentional recess 162 in the isolation region 158, as shown in FIGS. 3c and 3d. The planar partially-depleted transistor 150 of FIG. 3c has a width that is much bigger than the maximum depletion layer width $W_{d,max}$. When the active region width W (see FIG. 3d) is reduced to less than twice the depletion width layer in the body, the gate field encroaches from the isolation edges and eliminates the undepleted body region, thereby making the device of FIG. 3d fully depleted.

The resulting FD-SOI device has a non-planar geometry and is a multiple-gate transistor where the gate electrode 160 surrounds the transistor body 156 on multiple sides: the two sidewalls and the top surface. By having a gate electrode 160 that surrounds the transistor body 155, the multiple-gate transistor allows the encroachment of the gate electric field to the transistor body in the lateral direction, thus enhancing its ability to control short-channel effects.

Figure 4A:
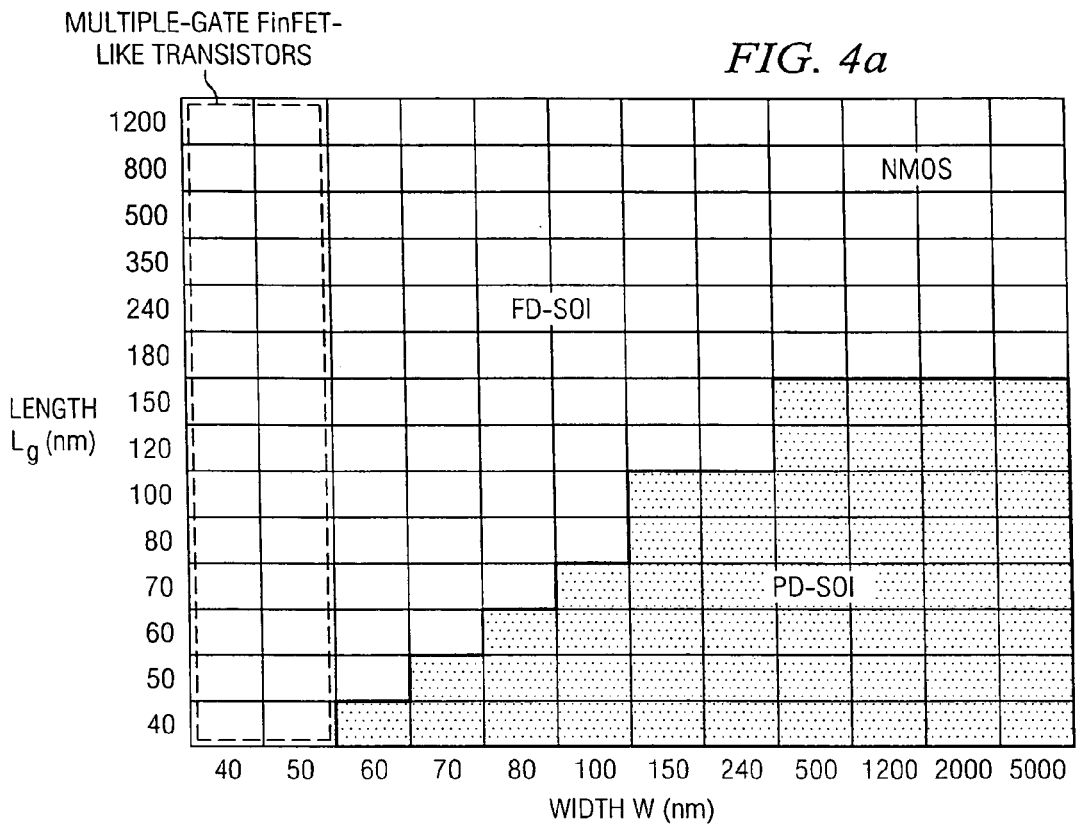
FIGS. 4a and 4b each provide a map showing the region of PD-SOI, FD-SOI, and multiple-gate transistors as a function of width W and length $L_g$ for NMOS (FIG. 4a) and PMOS (FIG. 4b) transistors.
Figure 4B:
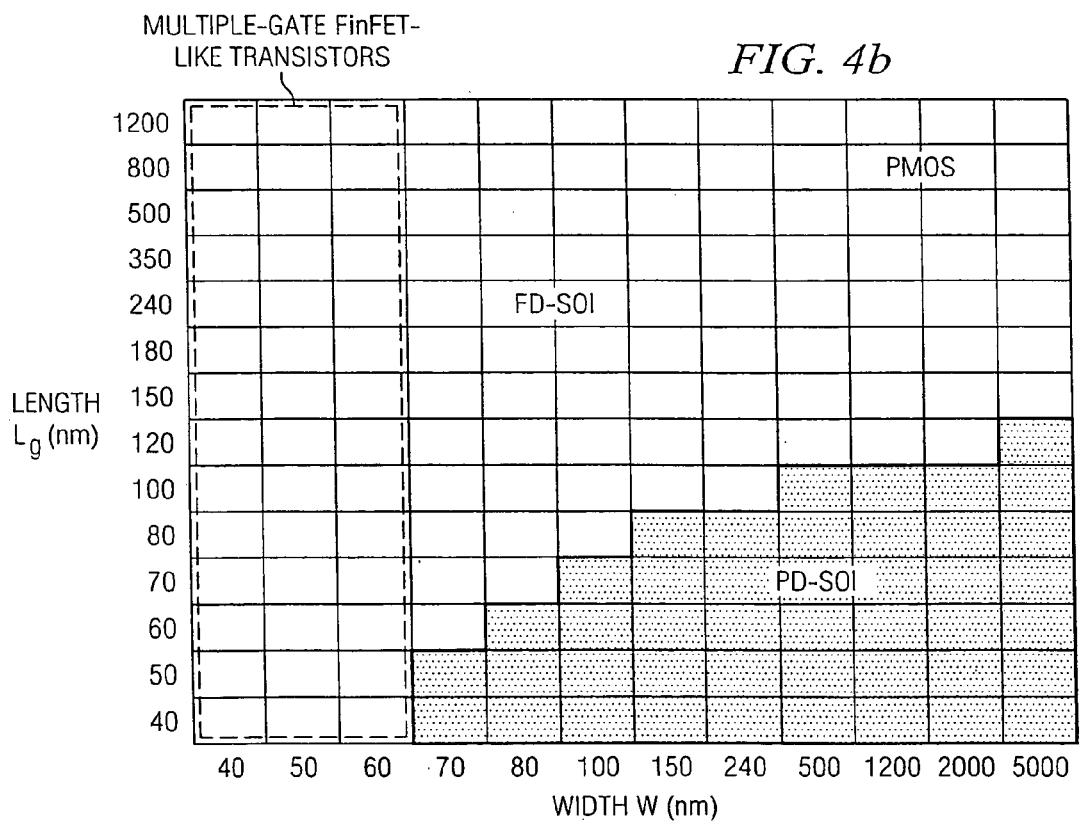

The preferred embodiment of this invention teaches a unique way of incorporating PD-SOI and FD-SOI transistors on the same chip using the same process technology, with a distribution of FD-SOI and PD-SOI transistors according to transistor dimensions. FIGS. 4a and 4b show the distribution of the PD-SOI and FD-SOI transistors according to the active region width W and the transistor gate length $L_g$. FIG. 4a provides data for NMOS devices and FIG. 4b shows data for PMOS devices. These figures provide a map showing the region of PD-SOI transistors (gray region), conventional FD-SOI transistors (white region), and multiple-gate transistors (in region enclosed by dashed box) as a function of width W and length $L_g$ for NMOS and PMOS transistors.

Planar PD-SOI and FD-SOI transistors typically have active region width of more than 50 nm, while non-planar multiple-gate fully-depleted transistors generally have active region width of less than 50 nm. The results in FIG. 4 are obtained from an experiment where transistors are fabricated using a 65 nm PD-SOI-based process with a nominal gate length of 45 nm, a silicon body thickness of 40 nm, dual-doped poly-silicon gate electrodes, 14 angstroms nitrided gate oxide, and cobalt-silicided source/drain and gate.

The PD-SOI region is smaller for P-channel transistors (FIG. 4b) than for N-channel transistors (FIG. 4a) because the impact ionization induced parasitic bipolar action is weaker in P-channel transistors. The transition from PD- to FD-SOI occurs as the gate length is increased. In addition, the non-planar FinFET-like or multiple-gate transistors are obtained at small width W, typically less than 50 nm. Wide-channel devices with smaller gate length $L_g$ are partially-depleted, showing a characteristic kink in the drain current $I_{DS}$ versus drain voltage $V_{DS}$ curves. As W is reduced, transition from PD-SOI to FD-SOI occurs and the characteristic $I_{DS}$-$V_{DS}$ kink disappears.

It is clear that the advantages of PD-SOI and FD-SOI can be combined by using transistors with different combinations of W and $L_g$. For example, when converting a circuit design for bulk technology to a circuit design for SOI technology, critical portions of the circuits may employ FD-SOI devices to achieve minimal floating body effects while the remaining portions of the circuits may employ PD-SOI devices. For example, the critical portions of the circuits may include analog circuits and dynamic circuits.

Figure 5:
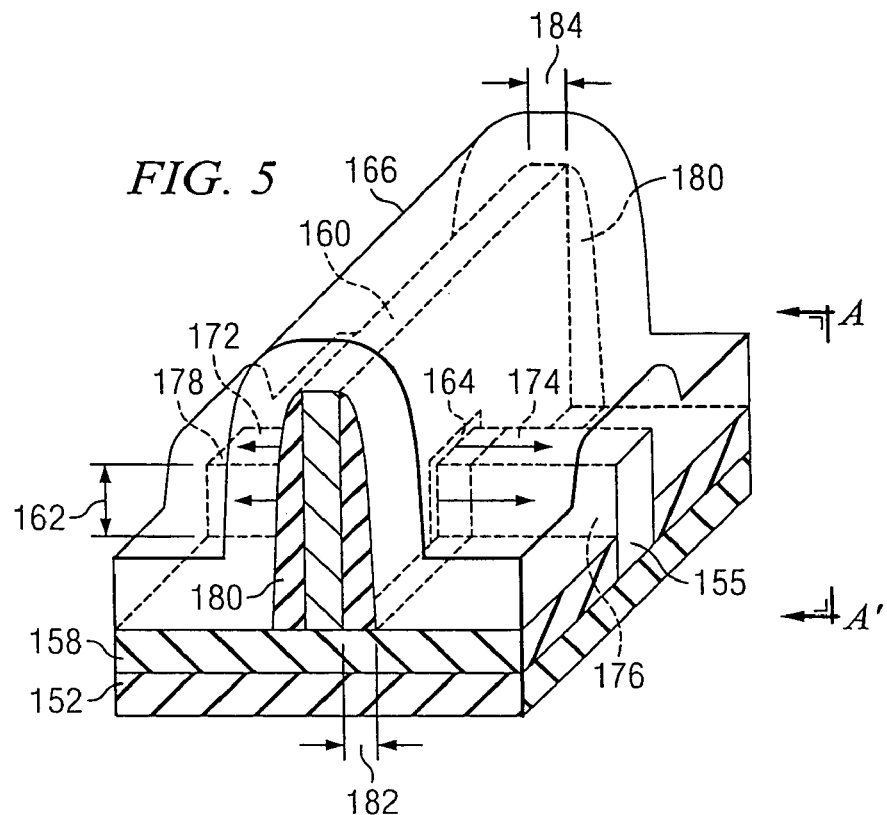
FIG. 5 shows the three-dimensional perspective of a strained-channel multiple-gate transistor of one embodiment of the present invention.

The quasi-planar device structure or geometry of the multiple-gate FD-SOI transistor will now be described further. FIG. 5 illustrates a three-dimensional view of a multiple-gate FD-SOI transistor. The multiple-gate FD-SOI transistor has a gate electrode 160 on top of a gate dielectric layer 164 covering the two sidewalls as well as the top of a fin-like active region 155. The gate dielectric 164 straddles across the fin 155, wrapping around the fin 155 on the top surface 178 and the two sidewalls 176 of the fin or fin-like active region 155. The gate electrode 160 is formed on the gate dielectric 164, also wrapping around the fin-like active region 155. Effectively, the gate electrode 160 forms three gates in the multiple-gate device: a gate on the top surface 178 of the fin 155, and one gate on each of the two sidewalls 176 of the fin 155.

Shallow trench isolation filling materials 158 such as silicon oxide, as shown in FIG. 5, may be used to fill the trenches surrounding the silicon fin 155. However, other isolation techniques, such as mesa isolation, as an example, may be used. When mesa isolation is used, no filling materials are used to fill the space surrounding the fin 155. It is noted that the source 172 and drain 174, which were not visible in the views shown in FIGS. 3c and 3d, can now be seen.

FIG. 5 also shows the gate spacer 180 that surrounds the gate 160. The gate space has a spacer width 182. The gate also has a gate length 184, which determines the channel length of the transistor. The channel width is determined by the size of the exposed fin sidewalls 176 and top surface 178.

The novel transistor geometry according to this embodiment of the invention not only provides for the encroachment of electric field lines from the sides of the transistor to obtain full-body depletion and/or enhanced short-channel immunity, but also provides for enhanced strain effects. The enhancement of strain-induced transistor performance improvement provides one feature that can be incorporated with the present invention.

The novel device geometry of this embodiments of the invention provides for enhanced strain effects as follows. The contact area between the silicon body and a stressor is increased by allowing the stressor to contact the silicon body on the sidewalls of the silicon body. As a result of the increased influence of the stressor on the active region, strain in a strained channel transistor is enhanced. This technique is illustrated more clearly in a three-dimensional perspective of the multiple-gate transistor in FIG. 5. The stressor 166 not only contacts the top surface of the silicon fin 155, but also the sidewall surfaces of the silicon fin 155. The additional contact area between the stressor 166 and the silicon fin 155 on the two sidewalls of the silicon fin results in enhanced stress effects in the silicon fin 155. As a result, a strained-channel multiple-gate transistor may be formed with significantly enhanced performance. The arrows in FIG. 5 indicate the stress experienced by the channel region of the multiple-gate transistor.

The stressor 166 may be a high-stress material such as silicon nitride (e.g., Si3N4) deposited by plasma-enhanced chemical vapor deposition (PECVD). The stress in the PECVD silicon nitride can be in the range of −500 megapascals (MPa) to 1500 MPa, where negative stress indicates compressive stress and positive stress indicates tensile stress. As the channel width W decreases, the sidewall contact area as a proportion of the total contact area between the silicon fin 155 and the stressor 166 increases. Therefore, the enhancement in stress effects is expected to increase with a reduction in W.

Figure 6A:
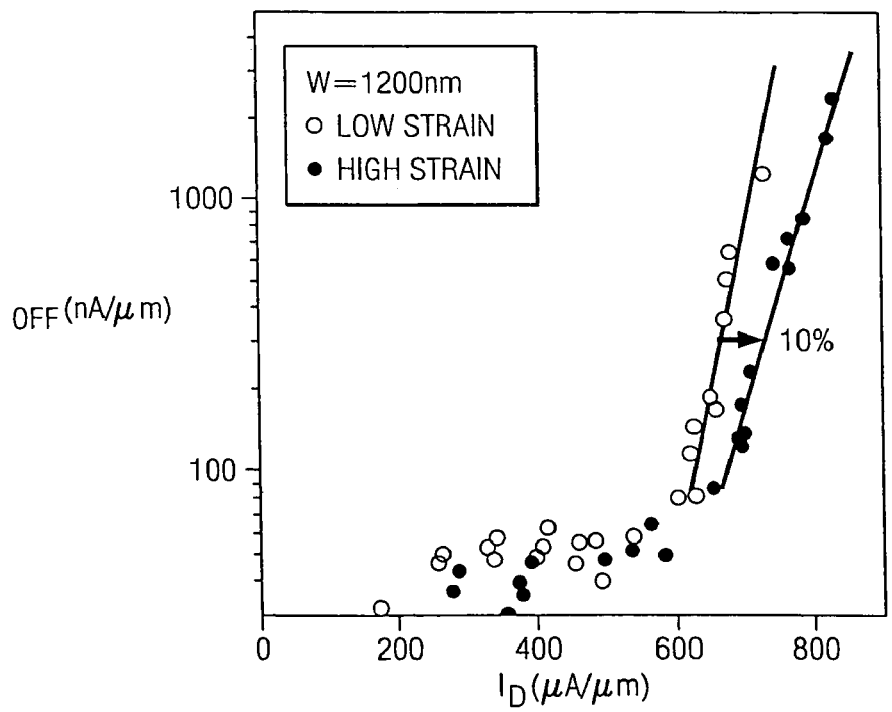
FIGS. 6a and 6b provide charts that show that the strain-induced drive current enhancement is increased as the channel width is reduced.
Figure 6B:
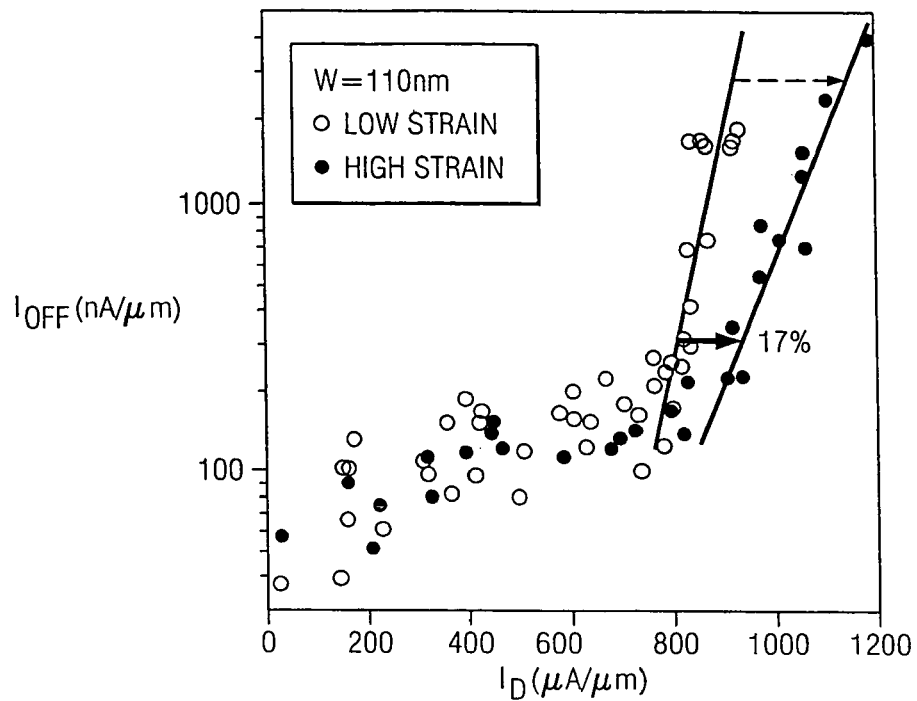

This prediction of enhanced drive current is confirmed by our experimental results as shown in FIGS. 6a and 6b. Strain-induced drive current enhancement is increased from 10% to 17% as the W is reduced from 1200 nm to 110 nm at an off-state leakage of 300 nA/micrometer. With further scaling of the gate length, the enhancement (dashed arrow) will become even larger, which is attributed to larger channel stress. Operation voltage is 1.0 V.

Figure 7:
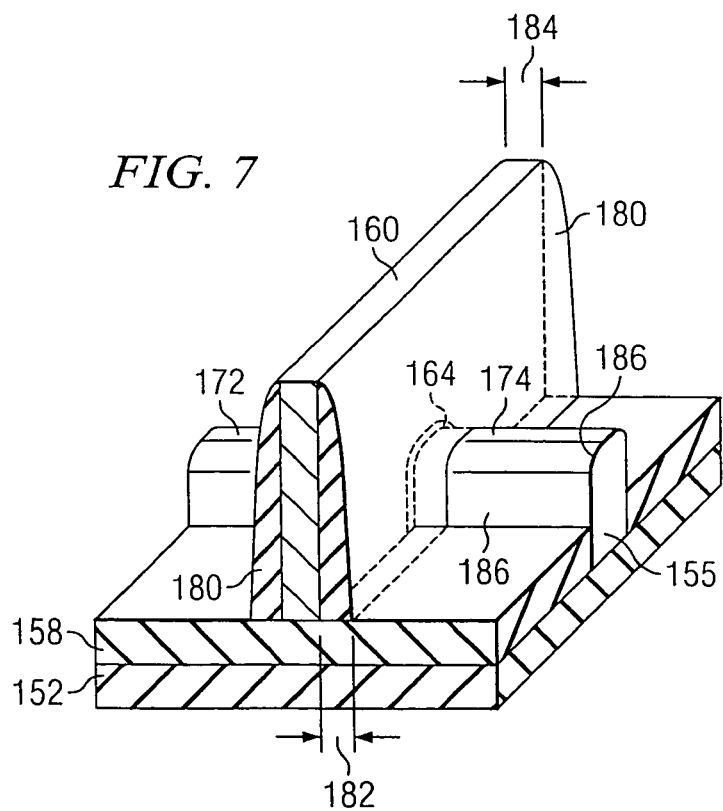
FIG. 7 shows the three-dimensional perspective of a strained-channel multiple-gate transistor where the silicon fin has rounded corners.

The silicon fin 155 of the multiple-gate transistor may have rounded corners 186, as shown in the three-dimensional perspective of FIG. 7. In FIG. 7, the stressor 166 is not shown for the sake of simplicity. The novel corner rounding at the isolation edge of the active region 155 of the multiple-gate transistor is another feature of the present invention to avoid double-hump $I_{GS}$-$V_{GS}$ characteristics. Rounded corners, as compared with sharp corners, avoid excessive stress concentration in a small region that may result in defect generation and propagation. Such defects may result in degraded device performance and reduced yield.

Figure 8A:
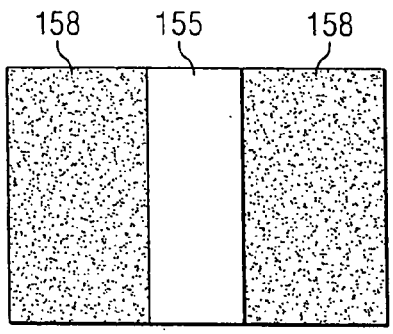
FIG. 8a shows a top view of an active region or silicon fin.

FIG. 8a shows the top view of the active region 155 or silicon fin 155 after the patterning of an active region surrounded by isolation regions 158. The cross-sectional view of this device is illustrated in FIG. 8b, in which the isolation region 158 is depicted as a shallow trench isolation with an intentional recess 162 of amount R, where R may be greater than about 300 angstroms.

Figure 8B:
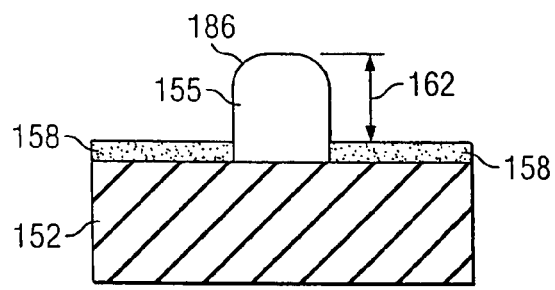
FIGS. 8b and 8c provide cross-sectional views of the active region or silicon fin showing the rounded corner with shallow trench (FIG. 8b) isolation or with mesa isolation (FIG. 8c)
Figure 8C:
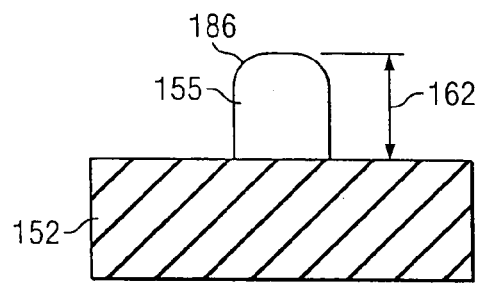

In another embodiment, as shown in FIG. 8c, a mesa isolation structure is used for isolation purposes. Mesa isolation is an isolation technique where silicon islands 155 are formed on an insulator 152 and electrically isolated from each other. The cross-sections in FIG. 8b and FIG. 8c emphasize the rounded corners 186 in the edge portions of the active region adjacent to the isolation regions.

The radius of curvature of the round corner 186 is denoted by r. The value of r may vary from about 10 angstroms to about 200 angstroms in preferred embodiments. Corner rounding of the active silicon region 155 may be achieved by processes such as etching, oxidation, and/or annealing, performed after the active region definition. It is understood that the round corner in the sectional view are in fact two round top edges of the active region in a three dimensional view.

FIGS. 8b and 8c schematically illustrate an intentional isolation recess 162 according to one example of the present invention. The recess R in both a shallow trench isolation or a mesa isolation is designed to be sufficiently large to allow the gate to deplete the narrow body from the isolation edges. In addition, the intentional recess will also give extra extended channel width. The value of R is preferably greater than about 300 angstroms. In general, R may be comparable to the thickness of the silicon film 155.

In addition, according to simulation and experimental results, the transistor performance enhancement due to the strain effects increases with reduced transistor dimensions such as gate length 184, spacer width 182, and silicon film 155 thickness. As shown experimentally in FIG. 6, reduction of the gate length 184 results in a larger strain-induced drive-current enhancement (dashed arrow). This is attributed to larger strain in the channel.

Figure 9:
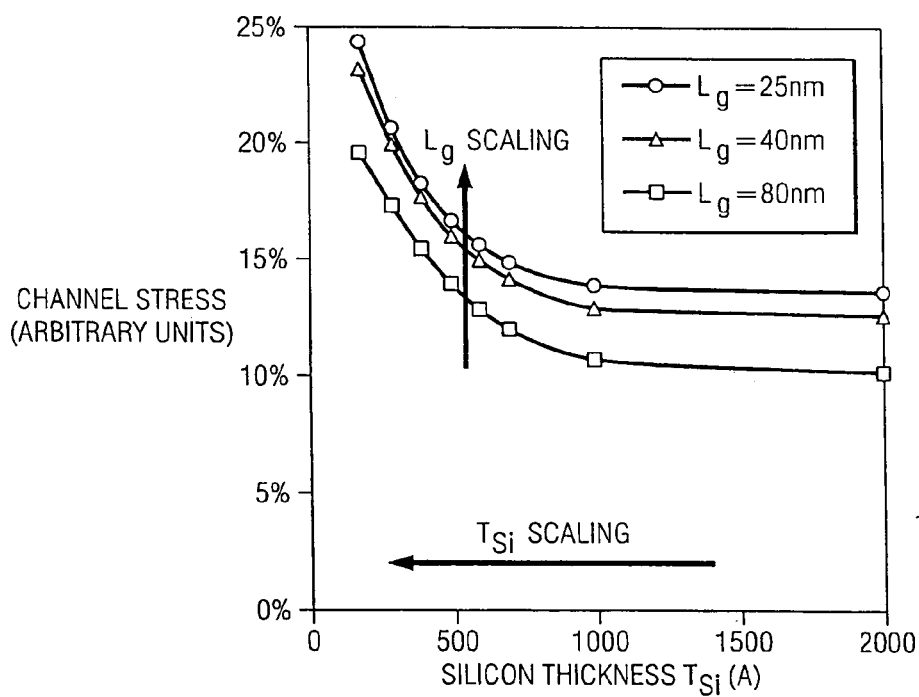
FIG. 9 provides a chart that shows that the stress in channel increases with reduced silicon film thickness and reduced gate length.
Figure 10:
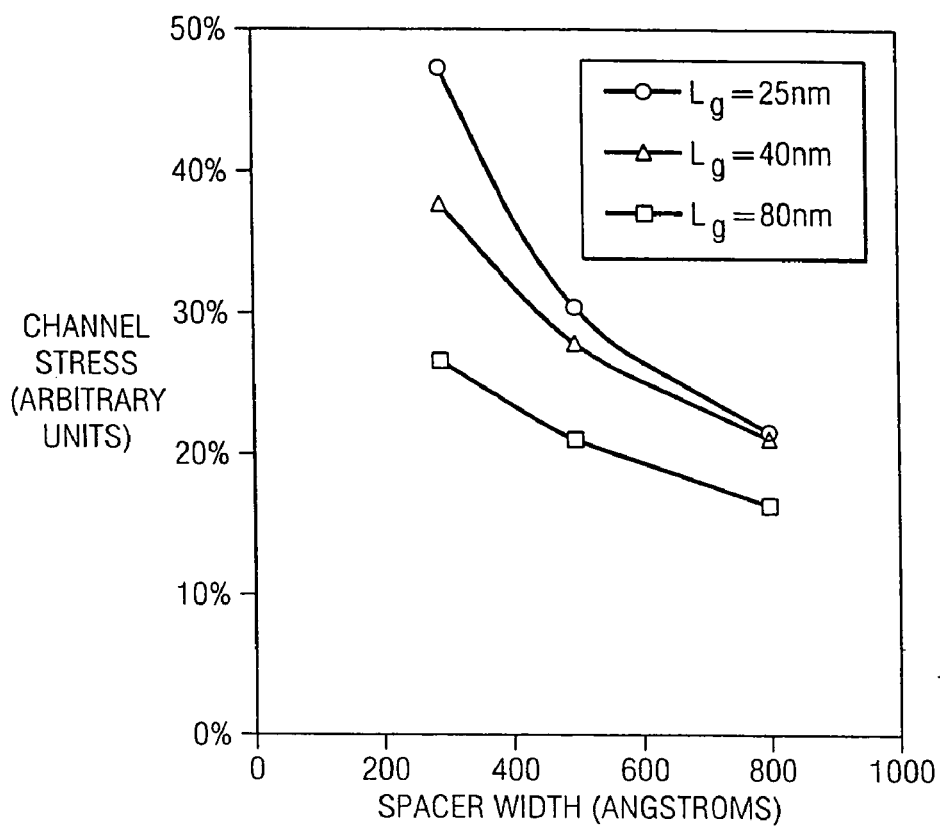
FIG. 10 provides a chart that shows that the stress in channel increases with reduced spacer width and reduced gate length.

In FIG. 9, the stress in the channel region of the silicon-on-insulator transistor is plotted as a function of the silicon film thickness for different gate lengths. The stress in the channel region increases as the silicon film 155 thickness is reduced and as the gate length 184 is reduced. In the preferred embodiment, the silicon film 155 thickness ranges from about 20 angstroms to about 400 angstroms. FIG. 10 shows that the stress in the channel increases as the spacer width 182 is reduced and as the gate length 184 is reduced. According to embodiments of this invention, a spacer width of less than about 500 angstroms can be especially beneficial for significantly enhanced stress effects. In the preferred embodiment, the spacer width ranges from about 10 angstroms to about 500 angstroms.

Figure 11:
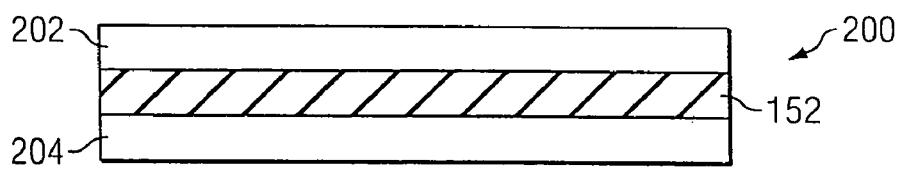
FIG. 11 shows a cross-section of the semiconductor-on-insulator starting material.

According to the next embodiment of this invention, a method of providing the abovementioned semiconductor-on-insulator chip with strained-channel partially-depleted SOI transistors, fully-depleted SOI transistors, and multiple-gate transistors will be described. The starting material is a semiconductor-on-insulator wafer 200 as shown in FIG. 11. The semiconductor-on-insulator wafer 200, includes a semiconductor layer 202 overlying an insulator layer 152 which in turn overlies a substrate 204. It is understood that the semiconductor layer 202 may be formed from an elemental semiconductor such as silicon or germanium, an alloy semiconductor such as silicon-germanium, or a compound semiconductor such as gallium arsenide or indium phosphide. The insulator layer 152 may be any insulating material such as silicon oxide, aluminum oxide, or silicon nitride or stacked combinations of these materials. The underlying substrate may be any semiconductor substrate such as silicon substrate or gallium arsenide substrate or non-semiconductor substrate such as quartz or sapphire. Other examples for each of these materials are envisioned.

The method embodiment is more clearly illustrated in FIGS. 12a-12j using a series of cross-sections depicting the transistor fabrication process. The cross-section of the device is taken in the plane containing the line A-A' and parallel to the active region or silicon fin 155 as shown in FIG. 5. The cross-section therefore cuts through the active region or silicon fin 155, i.e., the source region 172, channel region (unlabeled), drain region 174, gate dielectric 164, and the gate electrode 180 of the completed transistor. In this view the portion of the gate 160 that overlies the sidewalls 176 of active region 155 is not shown because it is in a plane above (and below) the plane of the page.

Figure 12A:
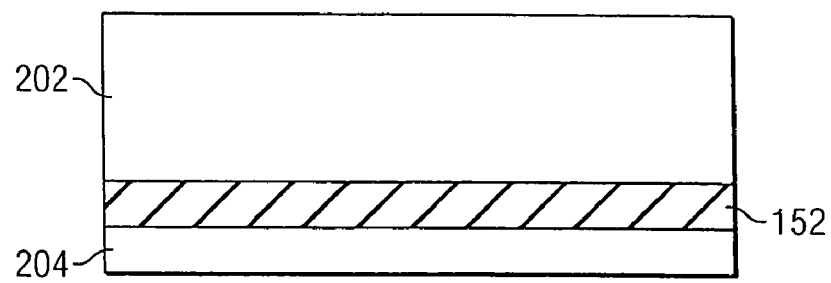
FIGS. 12a-12j provide cross-sections illustrating a process flow of one embodiment of the present invention.

In the preferred embodiment, a silicon-on-insulator wafer 200 is used as the starting material, as shown in FIG. 12a, where the semiconductor layer 202 is a silicon layer, the insulator layer 152 is a silicon oxide layer, and the substrate 204 is a silicon substrate. More preferably, the silicon layer 202 in the preferred embodiment has a thickness in the range of about 10 angstroms to about 2000 angstroms and the silicon oxide layer may have a thickness in the range of about 100 to about 2000 angstroms.

Figure 12B:
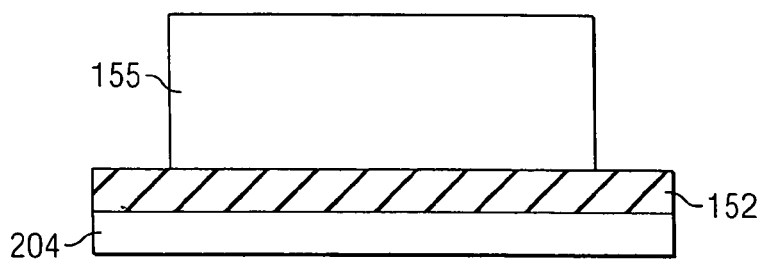

An active region or silicon fin 155 is formed by patterning the silicon layer 202, as shown in FIG. 12b. The patterning of the active region or silicon fin 155 may be accomplished, for example, by depositing a mask material (not shown) on the silicon layer 202, patterning the mask material by optical lithography to form a patterned mask, etching the silicon layer 202, and removing the patterned mask. The mask material can be a photoresist, silicon nitride, or a stack comprising of a silicon nitride layer overlying a silicon oxide layer.

Figure 12C:
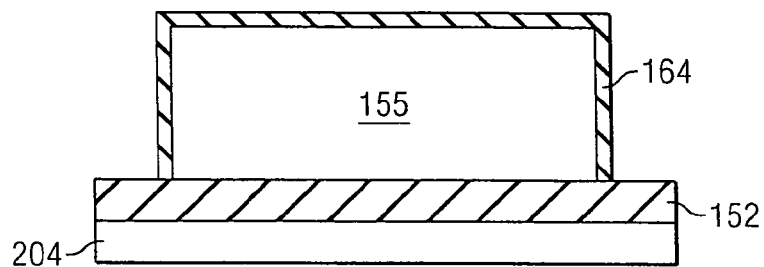

A gate dielectric layer 164 is formed, as shown in FIG. 12c. The gate dielectric layer 164 can have a thickness between about 3 to about 100 angstroms, as an example. The gate dielectric layer 164 on top 178 of the active region 155 can have a different thickness than the gate dielectric layer 164 on the two sidewalls 176. For example, the thickness of the gate dielectric layer 164 on the top 178 can be thinner than that on the sidewall 176. In some examples, the thickness of the gate dielectric layer 164 on top 178 of the active region 155 is less than about 20 angstroms.

The gate dielectric 164 may comprise of any gate dielectric material such as silicon oxide, silicon oxynitride, or nitrided silicon oxide. The insulating material 164 may also be a high permittivity material with permittivity larger than 5, such as aluminum oxide ($Al_2O_3$), hafnium oxide ($HfO_2$), halfnium silicon oxynitride (HfSiON), hafnium silicate (HfSiO$_4$), zirconium oxide ($ZrO_2$), zirconium silicate (ZrSiO$_4$) or lanthanum oxide ($La_2O_3$). In the preferred embodiment, the gate dielectric is silicon oxide, which may be formed by thermal oxidation in an oxygen ambient at temperatures ranging from about 500 to about 1000 degrees Celsius. The gate dielectric layer 164 can also be formed by chemical vapor deposition or reactive sputtering. The gate dielectric layer 164 covers the top 178 and the sidewalls 176 of the silicon fin 155.

With the gate dielectric layer 164 appropriately formed, the gate electrode 160 material can then be formed on top of the gate dielectric layer 164. The gate electrode 160 material can be comprised of conventional poly-crystalline silicon, poly-crystalline silicon germanium, metals, metallic silicides, metallic nitrides or other conductors. The gate electrode 160 material may be deposited by conventional techniques such as chemical vapor deposition. The gate electrode 160 may also be formed by the deposition of silicon and metal, followed by an anneal to form a metal silicide gate electrode material. An example, the silicide could be titanium silicide, nickel silicide or cobalt silicide.

Figure 12D:
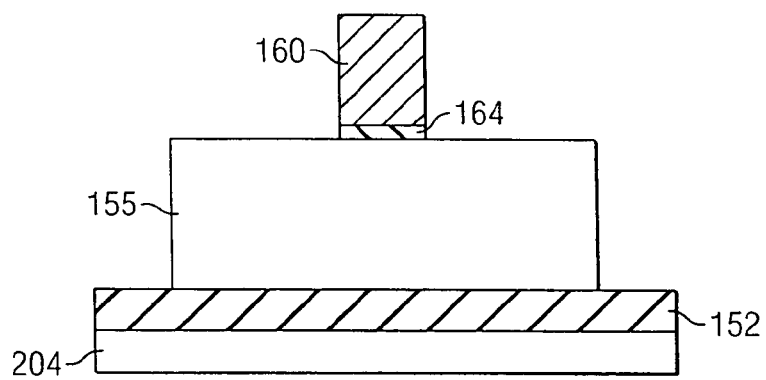

The gate electrode 160 material is then patterned using photolithography techniques, and etched using plasma etch processes to form the gate electrodes. FIG. 12d shows the device cross-section after gate electrode 160 formation. The gate dielectric 164 is retained at least in the portion of the device covered by the gate electrode 160.

Figure 12E:
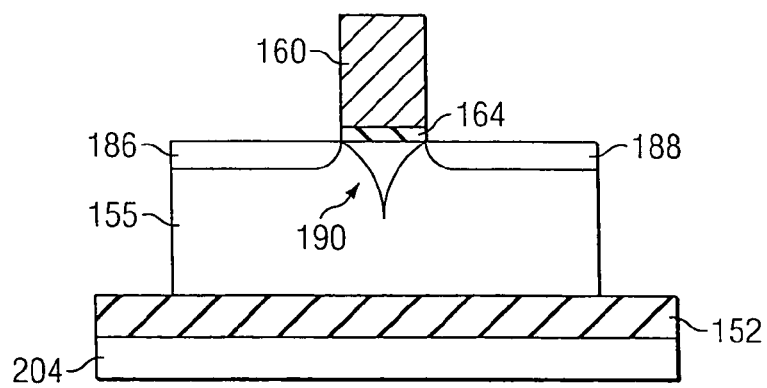

Source and drain extensions 186 and 188 are then implanted using ion implantation techniques as shown in FIG. 12e. Super-halo implant may also be performed at this stage. By implanting the super-halo implant at a large angle ranging from about 15 to about 45 degrees with respect to the normal of the wafer, devices with short channel lengths will receive a high effective channel doping concentration, while devices with long channel lengths will receive a low effective channel doping concentration.

Figure 12F:
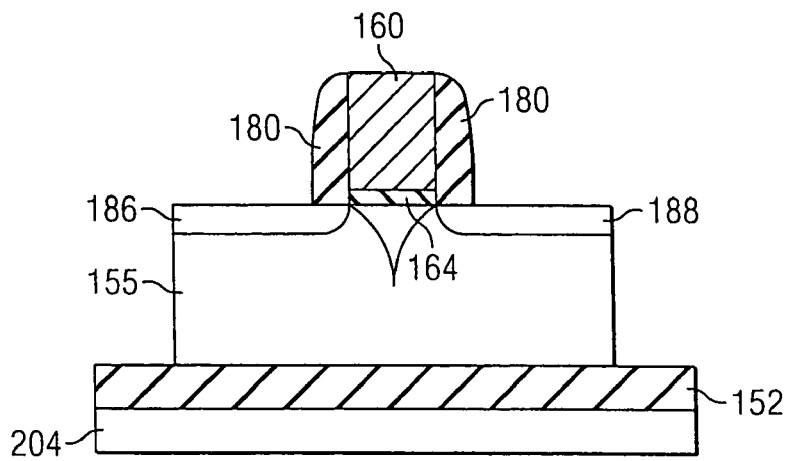

The super halo implant creates super halo regions 190. A spacer 180 is formed using techniques known and used in the art, e.g., deposition of the spacer material and anisotropic plasma etching as shown in FIG. 12f. The spacer material may comprise of a dielectric material such as silicon nitride or silicon dioxide. In the preferred embodiment, the spacer 180 is made from silicon nitride.

Figure 12G:
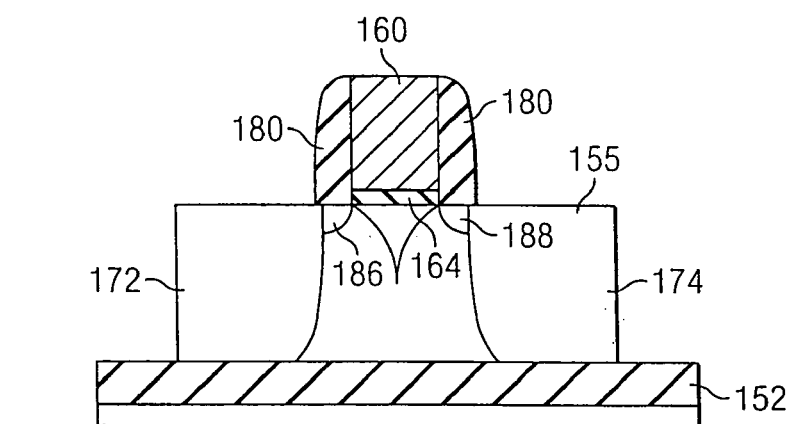
Figure 12H:
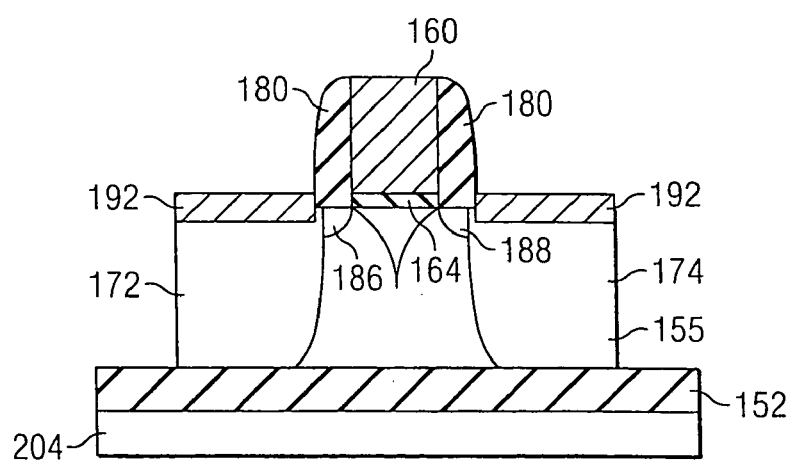

Following spacer formation, the source and drain regions 172 and 174 are implanted as shown in FIG. 12g. The source and drain regions 172 and 174 can be strapped with one or more conductive materials such as metals and silicides 192 as shown in FIG. 12h. The conductive materials 152 can reach the source and drain regions 172 and 174 through contacts on the sidewalls and/or the top of the active region 155.

Figure 12I:
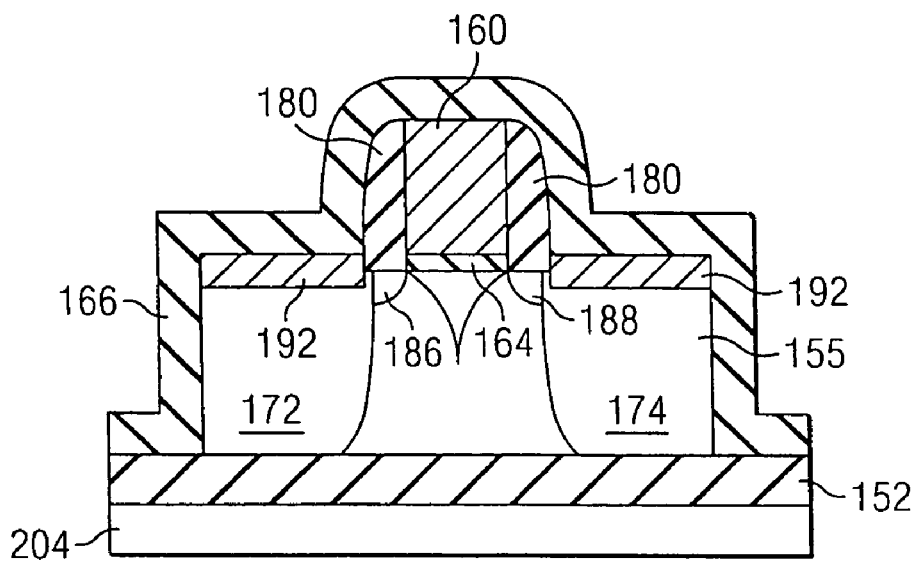

Next, a high-stress film or a stressor 166 is deposited over the completed transistor structure as shown in FIG. 12i. According to preferred embodiment of this invention, the high stress film 166 not only contacts the top surface 178 of the active region 155 but also the sidewall surfaces 176 of the active region 155, as shown in FIG. 5. As an example, the high-stress film 166 can be PECVD silicon nitride. PECVD silicon nitride can be used to introduce tensile or compressive stress in the channel region.

The residual film stress impacts the strain components in the channel. The residual film stress can be tailored from a high state of tension, for stoichiometric silicon nitride, to one of compression, for silicon-rich films. The tensile or compressive nature of the strain in the channel region can therefore be adjusted by varying process conditions such as temperature, pressure, and the ratio of the flow rate of a precursor gas, e.g., dichlorosilane, to the total gas flow rate.

Figure 12J:
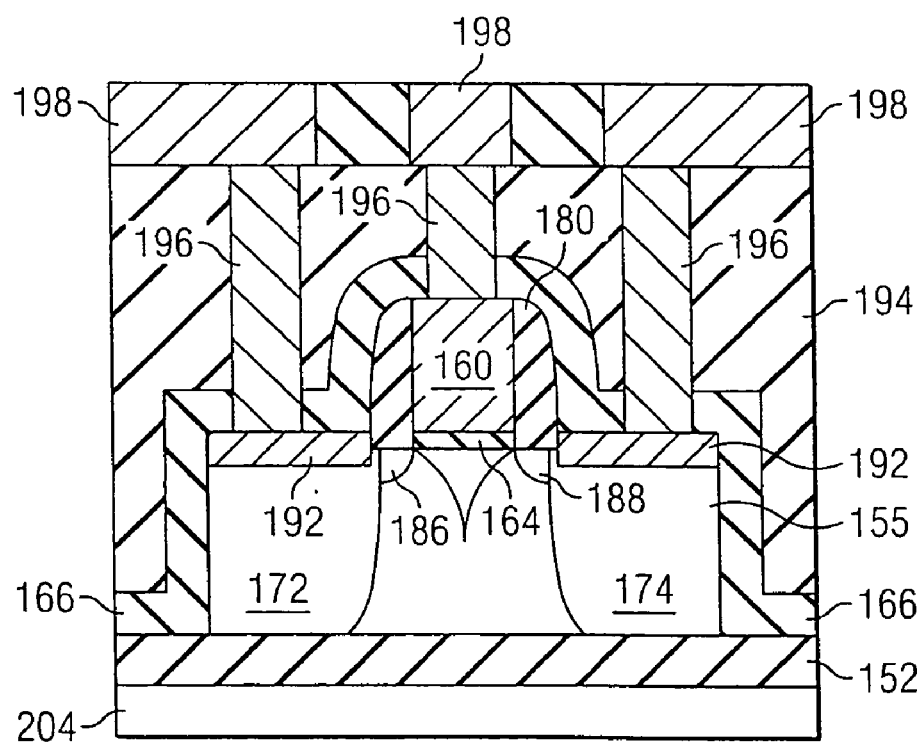

Following the formation of the high-stress film 166, a passivation layer 194 is deposited with a thickness of a few thousand angstroms, e.g., about 1000 to about 5000 angstroms. The passivation layer 194 is preferably comprised of silicon oxide (e.g., formed by decomposition of TEOS or doped silicon oxide e.g., PSG or BPSG). Contact holes are etched through the passivation layer 194 and the high-stress film 166 and are filled with conductive materials 196 to electrically contact the source region 172, drain region 174, and gate electrode 160 of the transistor, as shown in FIG. 12j. Metalization 198 can then be used to electrically couple these regions with other regions in the chip.

In summary, one aspect of the present invention provides an improvement over PD-SOI or FD-SOI technologies. The present invention can selectively combine the advantages of PD-SOI and FD-SOI. For example, when converting circuit design from bulk to SOI, this invention can achieve minimal floating body effects at critical circuits like analog circuits using FD-SOI devices, and can also have the freedom to adopt multiple threshold voltage $V_{th}$ devices in the PD-SOI region. Another noticeable improvement of the preferred embodiment of the present invention is its introduction of FinFET-like devices, which benefit scalability and control of short-channel effects. The semiconductor technology disclosed herein may be referred to as FinFET/FD/PD-SOI ("FiP-SOI"). In yet another aspect of the invention is the provision of enhanced strain effects for improving transistor performance in the abovementioned transistors.

As discussed above, the silicon fin 155 can be stressed by stressor layer 166. The active area 155 can also be strained by way of the underlying layer. For example; the silicon active area film can comprise a silicon layer formed over a silicon-geranium (SiGe) layer. The SiGe layer will cause a strain in the silicon layer.

In another embodiment, the silicon film for active area 155 can be formed using techniques taught in co-pending application Ser. No. 10/379,873 (TSMC2002-1384), filed Mar. 5, 2003, and incorporated herein by reference. In this embodiment, the silicon layer 202 is formed on a donor substrate and attached above buried insulator 152 using wafer separation and bonding techniques. The various embodiments taught in the co-pending application can be utilized here.

In the foregoing specification, the invention has been described with reference to specific embodiments. However, various modifications and changes can be made by one skilled in the art without departing from the scope of the present invention. Accordingly, the specification and figures are to be regarded in an illustrative rather than a restrictive sense, and all such modifications are intended to be included within the scope of the present invention. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method of forming a silicon-on-insulator device with a strained channel, the method comprising:

providing a silicon-on-insulator substrate, the substrate comprising a plurality of silicon fins electrically isolated from each other by shallow trench isolation, each silicon fin of said plurality extending between first and second ends and overlying at least one portion of an insulator layer, and each of said silicon fins defining an active region having a top surface and a pair of sidewalls;

forming a gate dielectric layer, over an intermediate portion of said top surface and said pair of sidewalls of said plurality of said silicon fins;

forming a gate electrode covering the gate dielectric layer;

forming source and drain regions in each of said silicon fins, one each of said source and drain region adjacent to one of said first and second ends and each adjacent to the gate electrode;

forming a high-stress film covering the gate electrode, source region, and drain region.

2. The method of claim 1 wherein the high stress film contacts the sidewall surfaces of the active region.

3. The method of claim 1 and further comprising after forming the gate electrode, forming source and drain extension regions.

4. The method of claim 3 wherein the source and drain extension regions are formed by ion implantation.

5. The method of claim 3 and further comprising, after forming the source and drain extension regions, forming super halo region.

6. The method of claim 5 wherein the super halo region is formed by ion implantation.

7. The method of claim 5 wherein the super halo region has a doping concentration in the range of about $1\times10^{18}$ to about $2\times10^{19}$ cm$^{-3}$.

8. The method of claim 3, and further comprising, after of forming the source and drain extension regions, forming spacers adjacent to the gate electrode.

9. The method of claim 8 wherein the spacers are formed by chemical vapor deposition of spacer material followed by anisotropic plasma etching.

10. The method of claim 8 wherein the spacers have a width of less than about 500 angstroms.

11. The method of claim 1 wherein the silicon fin has a thickness in the range of about 10 angstroms to about 2000 angstroms.

12. The method of claim 1 wherein the silicon fin has a thickness of less than about 200 angstroms.

13. A method of forming a silicon-on-insulator device with a strained channel, the method comprising:

providing a silicon-on-insulator substrate, the substrate comprising a silicon layer overlying an insulator layer;

defining at least one active region in the silicon layer, said active region having rounded corners, said rounded corners having a radius of about 10 angstroms to about 200 angstroms;

forming a gate dielectric layer in the active region;

forming a gate electrode on the gate dielectric layer;

forming source and drain regions adjacent to the gate electrode; and forming a high-stress film covering the gate electrode, source region, and drain region.

14. The method of claim 13 wherein the high stress film contacts said pair of sidewalls of the active region.

15. The method of claim 13 and further comprising after forming the gate electrode, forming source and drain extension regions.

16. The method of claim 15 wherein the source and drain extension regions are formed by ion implantation.

17. The method of claim 15 and further comprising, after forming the source and drain extension regions, forming super halo region.

18. The method of claim 17 wherein the super halo region is formed by ion implantation.

19. The method of claim 17 wherein the super halo region has a doping concentration in the range of about $1\times10^{18}$ to about $2\times10^{19}$ cm$^{-3}$.

20. The method of claim 15, and further comprising, after of forming the source and drain extension regions, forming spacers adjacent to the gate electrode.

21. The method of claim 20 wherein the spacers are formed by chemical vapor deposition of spacer material followed by anisotropic plasma etching.

22. The method of claim 20 wherein the spacers have a width of less than about 500 angstroms.

23. The method of claim 13 wherein the silicon layer has a thickness in the range of about 10 angstroms to about 2000 angstroms.

24. The method of claim 13 wherein the silicon layer has a thickness of less than about 200 angstroms.

25. The method of claim 13 wherein the at least one active region comprises a plurality of active regions that are electrically isolated from each other by shallow trench isolation.

26. The method of claim 13 wherein the at least one active region comprises a plurality of active regions that are electrically isolated from each other by mesa isolation.

* * * * *

UNITED STATES PATENT AND TRADEMARK OFFICE
CERTIFICATE OF CORRECTION

PATENT NO. : 7,268,024 B2
APPLICATION NO. : 10/999564
DATED : September 11, 2007
INVENTOR(S) : Yeo et al.

Page 1 of 1

It is certified that error appears in the above-identified patent and that said Letters Patent is hereby corrected as shown below:

On the cover page, Sect. (56) References Cited, (Continued) OTHER PUBLICATIONS, delete "Redce" and insert --Reduce--.
On the cover page, Sect. (56) References Cited, U.S. PATENT DOCUMENTS, Page 2, Second Column, line 22, delete "Kumagal" and insert --Kumagai--.
On the cover page, Sect. (56) References Cited, U.S. PATENT DOCUMENTS, Page 2, Second Column, line 23, delete "2004/0262663" and insert --2004/0262683--.
On the cover page, Sect. (56) References Cited, U.S. PATENT DOCUMENTS, Page 2, Second Column, line 26, delete "Ishitsuke" and insert --Ishitsuka--.

In the drawings, Sheet 3 of 9, FIG. 6a, delete "$_{OFF}(nA/\mu m)$" and insert --$|_{OFF}(nA/\mu m)$--.

In Col. 3, line 30, delete "at," and insert --al.,--.
In Col. 4, line 46, delete "Wand" and insert --W and--.
In Col. 7, line 24, delete "Wand" and insert --W and--.
In Col. 7, line 44, delete "Wis" and insert --W is--.
In Col. 8, line 44, delete "166" and insert --155--.
In Col. 8, line 45, delete "Si3N4" and insert --$Si_3N_4$--.
In Col. 8, line 58, delete "Wis" and insert --W is--.

Signed and Sealed this

Twenty-seventh Day of November, 2007

JON W. DUDAS
*Director of the United States Patent and Trademark Office*